United States Patent [19]
Carey et al.

[11] Patent Number: 5,817,550
[45] Date of Patent: Oct. 6, 1998

[54] METHOD FOR FORMATION OF THIN FILM TRANSISTORS ON PLASTIC SUBSTRATES

[75] Inventors: Paul G. Carey, Mountain View; Patrick M. Smith, San Ramon; Thomas W. Sigmon, Portola Valley; Randy C. Aceves, Livermore, all of Calif.

[73] Assignee: Regents of the University of California, Oakland, Calif.

[21] Appl. No.: 611,318

[22] Filed: Mar. 5, 1996

[51] Int. Cl.$^6$ .......................... H01L 21/268; H01L 21/84
[52] U.S. Cl. ..................... 438/166; 438/487; 438/308; 438/535
[58] Field of Search .................. 437/19, 21, 40 TFT, 437/40 TFI, 41 TFT, 41 TFI, 173, 174, 907, 908; 148/DIG. 90–DIG. 93; 257/66, 70; 438/166, 308, 487, 535

[56] References Cited

U.S. PATENT DOCUMENTS

| | | | |
|---|---|---|---|
| 5,254,208 | 10/1993 | Zhang | 437/174 |
| 5,268,783 | 12/1993 | Yoshinaga et al. | |
| 5,346,850 | 9/1994 | Kaschmitter et al. | 437/81 |
| 5,395,481 | 3/1995 | McCarthy | 156/630 |
| 5,399,231 | 3/1995 | McCarthy | 156/630 |
| 5,403,762 | 4/1995 | Takemura | 437/173 |
| 5,414,276 | 5/1995 | McCarthy | 257/57 |
| 5,456,763 | 10/1995 | Kaschmitter et al. | 437/174 |
| 5,523,587 | 6/1996 | Kwo | 257/64 |
| 5,555,240 | 9/1996 | Nishi et al. | |

FOREIGN PATENT DOCUMENTS

| | | |
|---|---|---|
| 5-315361 | 11/1993 | Japan. |
| 7-81919 | 3/1995 | Japan. |

OTHER PUBLICATIONS

E. Lueder, Mat. Res. Soc. Symp. Proc. 377(Apr. 1995)847 "Trends of research in active addressing of LCDs".

H. Ohshima et al., SID '93 Digest, p. 387 "Full–Color LCDs with . . . Low Temperature Poly–Si TFTs".

A. Slaoui et al., Appl. Phys. A, 59(1994)203 "Fabrication and doping of poly–SiGe using excimer–laser processing".

C.D. Kim et al. "Amorphous–Silicon Distributed–Threshold Voltage Transistors with Self–Aligned Poly–Silicon Sources and Drains," IEEE Transactions on Electron Devices, vol. 41, No. 9, Sep. 1994.

A. Kohno et al., "High Performance Poly–Si TFTs Fabricated Using Pulsed Laser Annealing and Remote Plasma CVD with Low Temperature Processing," IEEE Transactions on Electron Devices, vol. 42, No. 2, Feb. 1995.

P.G. Carey et al., "Fabrication of Submicrometer MOSFET's Using Gas Immersion Laser Doping (GILD)," IEEE Electron Device Letters, vol. EDL–7, No. 7, Jul. 1986.

*Primary Examiner*—Charles L. Bowers, Jr.
*Assistant Examiner*—Leon Radomsky
*Attorney, Agent, or Firm*—L. E. Carnahan

[57] ABSTRACT

A process for formation of thin film transistors (TFTs) on plastic substrates replaces standard thin film transistor fabrication techniques, and uses sufficiently lower processing temperatures so that inexpensive plastic substrates may be used in place of standard glass, quartz, and silicon wafer-based substrates. The process relies on techniques for depositing semiconductors, dielectrics, and metals at low temperatures; crystallizing and doping semiconductor layers in the TFT with a pulsed energy source; and creating top-gate self-aligned as well as back-gate TFT structures. The process enables the fabrication of amorphous and polycrystalline channel silicon TFTs at temperatures sufficiently low to prevent damage to plastic substrates. The process has use in large area low cost electronics, such as flat panel displays and portable electronics.

16 Claims, 2 Drawing Sheets

METHOD FOR FORMATION OF THIN FILM TRANSISTORS ON PLASTIC SUBSTRATES

The United States Government has rights in this invention pursuant to Contract No. W-7405-ENG-48 between the Unites States Department of Energy and the University of California for the oper Lawrence Livermore National Laboratory.

BACKGROUND OF THE INVENTION

The present invention relates to thin film transistors, particularly to the fabrication of thin film transistors, and more particularly to a method for the formation of silicon based thin film transistors on inexpensive, low-temperature plastic substrates.

Conventional processing techniques used to fabricate high-performance (polycrystalline) silicon thin film transistors (TFTs) require processing temperatures of at least 600° C. This minimum temperature requirement is imposed by silicon crystallization and dopant activation anneals. Although amorphous silicon (a-Si) TFT's (which do not require crystallization and activation anneals) can be fabricated at much lower temperatures (as low as 250° C.), the poor performance of these devices severely limits their range of applications. One of the factors limiting the minimum process temperatures for a-Si devices is that a-Si deposited at very low temperatures contains excessive hydrogen resulting from the deposition process (such as PECVD). Amorphous silicon films deposited by other techniques, such as sputtering or evaporation, are found to have poor electrical properties, rendering them marginally useful for most TFT applications.

Recently a process was developed for crystallizing and doping amorphous silicon on a low cost, so-called low-temperature plastic substrate using a short pulsed high energy source in a selected environment, without heat propagation and build-up in the substrate so as to enable use of plastic substrates incapable of withstanding sustained processing temperatures higher than about 180° C. Such a process is described and claimed in U.S. Pat. No. 5,346,850 issued Sep. 13, 1994 to J. L. Kaschmitter et al., assigned to the Assignee of the instant application. Also, recent efforts to utilize less expensive and lower temperature substrates have been carried out wherein the devices were formed using conventional temperatures on a sacrificial substrate and then transferred to another substrate, with the sacrificial substrate thereafter removed. Such approaches are described and claimed in U.S. Pat. Nos. 5,395,481 issued Mar. 7, 1995, No. 5,399,231 issued Mar. 21, 1995, and No. 5,414,276 issued May 9, 1995, each issued to A. McCarthy and assigned to the assignee of the instant application.

As exemplified by above-referenced U.S. Pat. No. 5,346,850, high performance polycrystalline silicon devices have been produced at low temperatures (<250° C.). This is accomplished by crystallizing the amorphous silicon layer (and activating dopants) with a short-pulse ultra-violet laser, such as an XeCl excimer laser having a wavelength of 308 nm. The extremely short pulse duration (20–50 ns) allows the silicon thin film to melt and recrystallize without damaging the substrate or other layers in the device. Polycrystalline layers produced in this manner provide high carrier mobilities and enhanced dopant concentrations, resulting in better performance.

The present invention provides a method or process for fabricating amorphous and polycrystalline channel silicon TFT's at temperatures sufficiently low to prevent damage to low cost, so-called low-temperature plastic substrates, whereby the use of high cost, so-called high temperature plastics, such as KAPTON, manufactured by Dupont Corp., and capable of withstanding temperatures of 400–450° C., can be eliminated, thus reducing the manufacturing costs as well as significantly increasing the type of plastic substrates that can be utilized in the fabrication of TFTs. In addition, plastic substrates have several advantages over conventional substrates, such as glass or silicon in that plastic can be much less expensive, lighter, more durable, rugged, and flexible.

SUMMARY OF THE INVENTION

It is an object of the present invention to enable fabrication of silicon-based thin film transistors on plastic substrates.

A further object of the invention is to provide a method for manufacturing thin film transistors wherein low cost, low-temperature substrates can be utilized.

Another object of the invention is to provide a method for fabricating thin film transistors involving replacement of standard fabrication procedures with procedures utilizing sufficiently lower processing temperatures so that inexpensive plastic substrates may be used.

Another object of the invention is to provide a method of fabricating thin film transistors wherein inexpensive plastic substrates may be used in place of standard glass, quartz, and silicon wafer-based substrates.

Another object of the invention is to enable the manufacture of thin film transistors using plastic substrates which enable use for large area low cost electronics, such as flat panel displays and portable electronics.

Other objects and advantages of the present invention will become apparent from the following description and accompanying drawings. The invention involves a method for the formation of thin film transistors on inexpensive plastic substrates. The method of this invention utilizes sufficiently lower processing temperatures so that inexpensive plastic substrates may be used. The so-called low-temperature plastic substrates have several advantages over conventionally used substrates such as glass, quartz, silicon, and high-temperature plastic (i.e. KAPTON). Processing temperatures of the method of this invention are such that sustained temperatures are below a temperature of 250° C. although short duration high temperatures are used during the processing. This is accomplished using pulsed laser processing which produces the needed temperatures for short time periods while maintaining the sustained temperature of the substrate below a damage threshold (i.e. below about 250° C.). Thus, by the use of fabrication techniques the sustained temperature of the substrate is sufficiently low to prevent damage to inexpensive low-temperature plastic substrates. The present invention provides a method which relies on techniques for depositing semiconductors, dielectrics, and metal at low temperatures, crystallizing and doping semiconductor layers in the TFT with a pulsed energy source, and creating top-gate, top-gate self-aligned, as well as back-gate TFT structures.

BRIEF DESCRIPTION OF THE DRAWINGS

The accompanying drawings, which are incorporated into and form a part of the disclosure, illustrate an embodiment of the invention and its fabrication method and, together with the description, serve to explain the principles of the invention.

DETAILED DESCRIPTION OF THE INVENTION

The present invention involves a method or process for fabrication of silicon thin film transistors (TFTs) on low-temperature plastic substrates. The method relies on techniques for depositing semiconductors, dielectrics, and metals at low temperatures, crystallizing and doping semiconductor layers in the TFT with a pulsed energy source, such as an excimer laser, and creating top-gate self-aligned as well as back-gate TFT structures. The present invention enables the fabrication of amorphous and poly-crystalline channel silicon TFTs at temperatures sufficiently low to prevent damage to plastic substrates. The substrate may be flexible or rigid. Low-temperature substrates are defined as those materials incapable of withstanding sustained processing temperatures higher than about 150°–250° C., compared to the so-called high-temperature materials such as silicon, glass, quartz, and KAPTON which can withstand sustained processing temperatures of 400° C. and higher. While the low-temperature substrate may be heated higher than about 150°–250° C. for short time durations, such may be damaged if that time duration is longer than about $10^5$ nanoseconds (100 $\mu$s).

SUMMARY OF THE PROCESS

Figure 1:
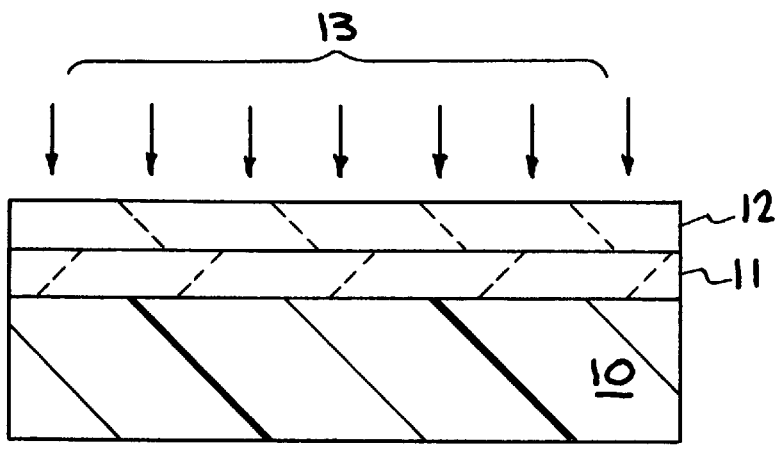
FIG. 1 is a cross-sectional view of a plastic substrate after bottom oxide and amorphous silicon depositions, and illustrating pulsed laser irradiation.

1. A plastic substrate 10, see FIG. 1, is, if needed, first annealed at a temperature above 100° C. (110 to 150° C.) to reduce deformation in subsequent process steps. An example of the plastic substrate 10 is the biaxially oriented semicrystalline polyester poly(ethylene terephthalate) (PET) which has an excellent optical quality and is low cost.

2. The plastic substrate 10 is then cleaned using a sequence of solvent or acid rinses.

3. The plastic substrate 10 is, where needed, coated with a first or "bottom" oxide or thermally insulating (dielectric) layer 11, such as $SiO^2$, having a thickness ranging from 0.1–5.0 $\mu$m (for example, 0.5–2.0 $\mu$m) by sputtering, physical vapor deposition (PVD), or plasma enhanced chemical vapor deposition (PECVD) performed at or below 100° C.

4. An amorphous silicon (a-Si) film 12 having a thickness ranging from 10–500 nm (for example, 50–100 nm) is then deposited on the oxide or insulating layer 11 by PECVD at a temperature of about 100° C.

Figure 3A:
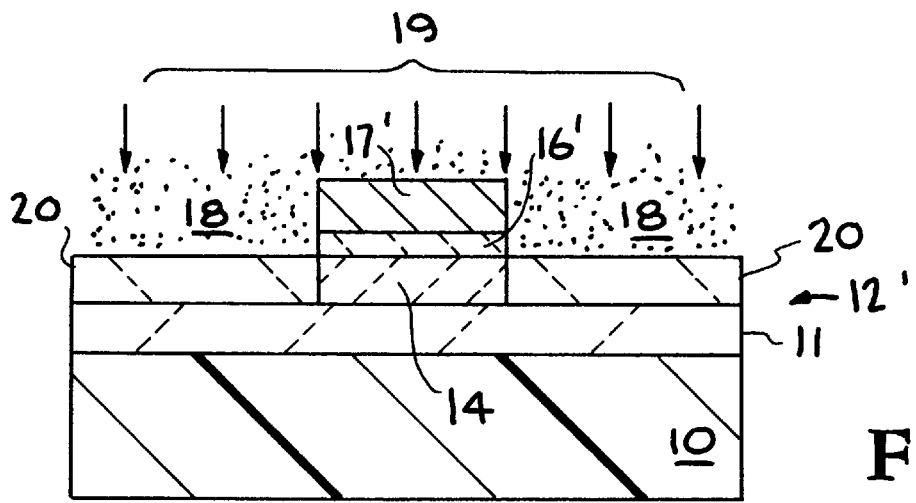
FIGS. 3A and 3B are cross-sections of a processed plastic substrate during gas immersion laser doping, with FIG. 3A showing the a-Si film of FIG. 1 crystallized, while in FIG. 3B the Si in the channel region remains amorphous.
Figure 3B:
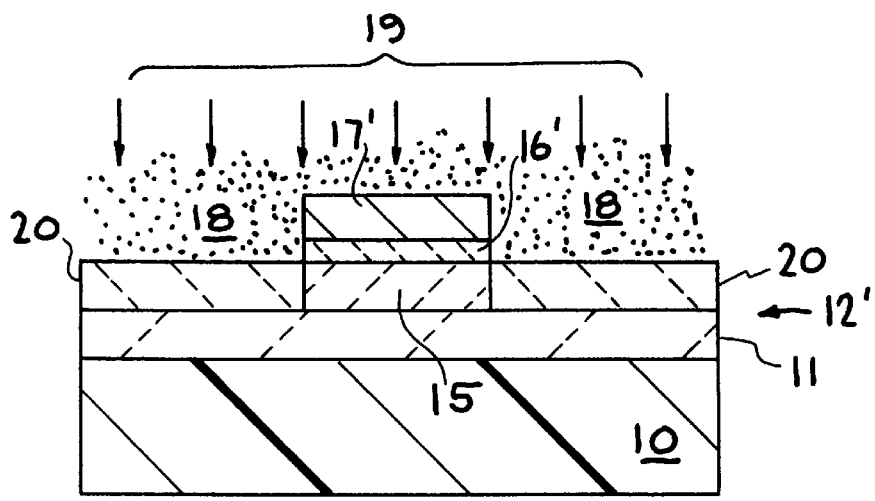

5. At this point, the a-Si film may or may not be crystallized by irradiating the film 12 with one or more laser pulses, as indicated at 13 in FIG. 1. Typically an excimer laser is used, such as an XeCl excimer laser having a 308 nm wavelength with, for example, the pulse or pulses being at about 30 nsec/pulse, full width at half maximum (FWHM), with an energy density (laser fluence) of about 30–600 mJ/cm$^2$, e.g., about 150 mJ/cm$^2$:

a) Irradiating the a-Si film 12 with one or more laser pulses will partially or completely crystallize the a-Si film, producing a fully or partially crystalline channel poly-Si TFT, such as indicated at 14 in FIG. 3A which will have much higher ON currents, higher mobilities, and lower threshold voltages than TFTs with a-Si channel material such as indicated at 15 in FIG. 3B. When multiple pulses are used, successive pulses or groups of pulses can have increasing laser fluence.

b) If the silicon layer is partially or completely crystallized, it may or may not be subsequently exposed to a low temperature (<250° C.) hydrogenation process for 30 seconds to one hour. One such hydrogenation process utilizes plasma enhanced chemical vapor deposition (PECVD).

c) If the a-Si film 12 is not irradiated, the channel region of the finished TFT will remain a-Si, resulting in lower ON and OFF currents and lower mobilities.

Figure 2:
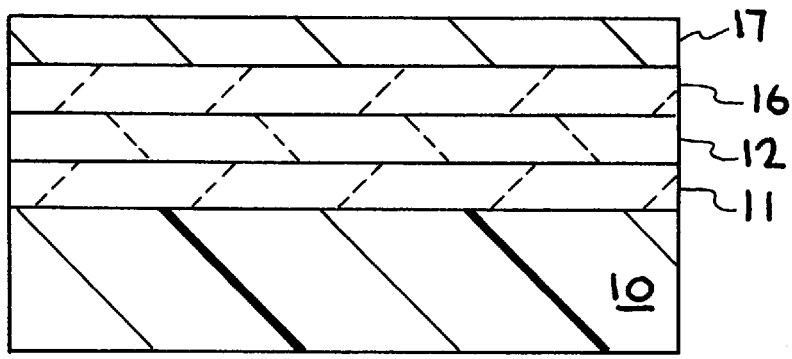
FIG. 2 is a cross-sectional view of a plastic substrate following oxide/silicon/oxide/metal depositions.

6. A second or "gate" oxide or insulating (gate dielectric) layer or film 16 having a thickness ranging from 20–500 nm (for example 100 nm) is then deposited on the silicon film 12, again by PECVD at about 100° C., or by other appropriate techniques, as seen in FIG. 2. The film or layer 16 may be composed of an oxide or a nitride or combination of oxide/nitride.

7. An aluminum (Al) "gate" metal film 17 having a thickness ranging from 50–1000 nm (for example 300 nm) is deposited on the oxide or insulating layer 16 by any suitable deposition technique, such as physical vapor deposition (PVD), chemical vapor deposition (CVD), evaporation, or sputtering, as seen in FIG. 2. Other metals or alloys such as Cu, Ni, Ti, Mo, Cr, Ta, W, Ti—Si, Ti—Al, Al—Si, and Al—Cu can be used as the "gate" metal film 17. Also silicon (Si) and silicides (defined as a silicon alloy with a refractory metal to form an intermediate binary phase) can be used as the "gate" material.

8. The TFT top-gate structure (gate level) is then patterned using standard photolithographic processing modified for plastic substrates. An example process follows:

a) The thus coated plastic substrate 10 is baked at 90° C. for 2 to 10 minutes, for example.

b) 1.4 $\mu$m of photoresist is spun on the coated substrate 10 with a wide range (0.5 $\mu$m to 2.5 $\mu$m) of photoresist film thicknesses being acceptable in this step.

c) The photoresist-coated substrate is pre-baked at 90° C. for 2 minutes.

d) The TFT gate pattern is exposed using a mask aligner.

e) The pattern is developed using a standard resist developer.

f) The photoresist-coated substrate is post-baked at 90° C. for 5 to 60 minutes, with 10 minutes in this example.

9. The gate pattern is defined using standard wet chemical and/or plasma etching techniques, an example of which follows:

a) The exposed Al film 17 is etched by immersion in Al-Type II etch, manufactured by Ashland Chemical, for 5 minutes or until etching is complete, leaving an area 17' of film 17 as seen in FIGS. 3A and 3B followed by a deionized water rinse. The etching time will vary with Al gate thickness and etch bath temperature (25 to 60° C.). Other wet chemical etches or dry etching processes may be substituted in this step.

b) The sections of oxide or insulating layer 16 now exposed by the Al etch is removed by immersion for 40 seconds in a well known etchant for etching oxide over contact metal pads, such as KTI Pad Etch I manufactured by Ashland Chemical, leaving an area 16' as seen in FIGS. 3A and 3B. This etching time will vary with the oxide or insulating layer 16 thickness. Other wet chemical etches or dry etching processes may be substituted in this step.

10. The remaining photoresist is removed using standard solvent and/or photoresist removal chemicals followed by rinse steps.

11. The source and drain regions of the silicon film 12' are crystallized and doped using Gas Immersion Laser Doping (GILD). See for example, P. G. Carey et al., IEEE Electron Device Lett. Vol. EDL-7, No. 7, pp. 440–442 (1986). An example is as follows:

a) The thus processed (coated) plastic substrate 10 is exposed to oxide etchant vapor if needed, such as HF vapor for several seconds (e. g. 2 sec to 30 sec) to remove native oxide from the exposed silicon layer or film 12.

b) The thus processed plastic substrate 10 is then placed in a gas cell evacuated to a base pressure on the order of 3 mTorr and subsequently filled to about 300 Torr with a dopant gas, for the GILD process, indicated at 18 in FIGS. 3A and 3B, such as $PF_5$, $BF_3$, $B_2H_6$, $PH_3$, $AsH_3$, and $AsF_5$. Other base and dopant gas pressures can be used.

c) The silicon film 12' is irradiated with several pulses (1 to 1000) of laser energy, indicated at 19 in FIGS. 3A and 3B at several laser fluences, increasing in steps from about 135 to about 270 $mJ/cm^2$ for a time duration of 10 to 150 ns/pulse. The range of laser fluences will vary depending on the exact combination of layer thickness and materials selected; the ultimate range of fluences could be as wide as 30–600 $mJ/cm^2$. As shown in FIG. 3A, the a-Si film 12 of FIGS. 1 and 2, now indicated at 12', has been previously crystallized (in Step 5 above) to form the fully poly-Si device 14, while as shown at 15 in FIG. 3B the Si in the channel region remains amorphous. Thus, in FIG. 3A, the silicon layer 12' is composed of an undoped poly-Si region 14 and doped poly-Si regions 20, while in FIG. 3B, the silicon layer 12' is composed of an undoped a-Si region 15 and doped poly-Si regions 20. Other techniques to provide the dopant may be used, such as a predeposited dopant film followed by excimer laser annealing (ELA).

Figure 4:
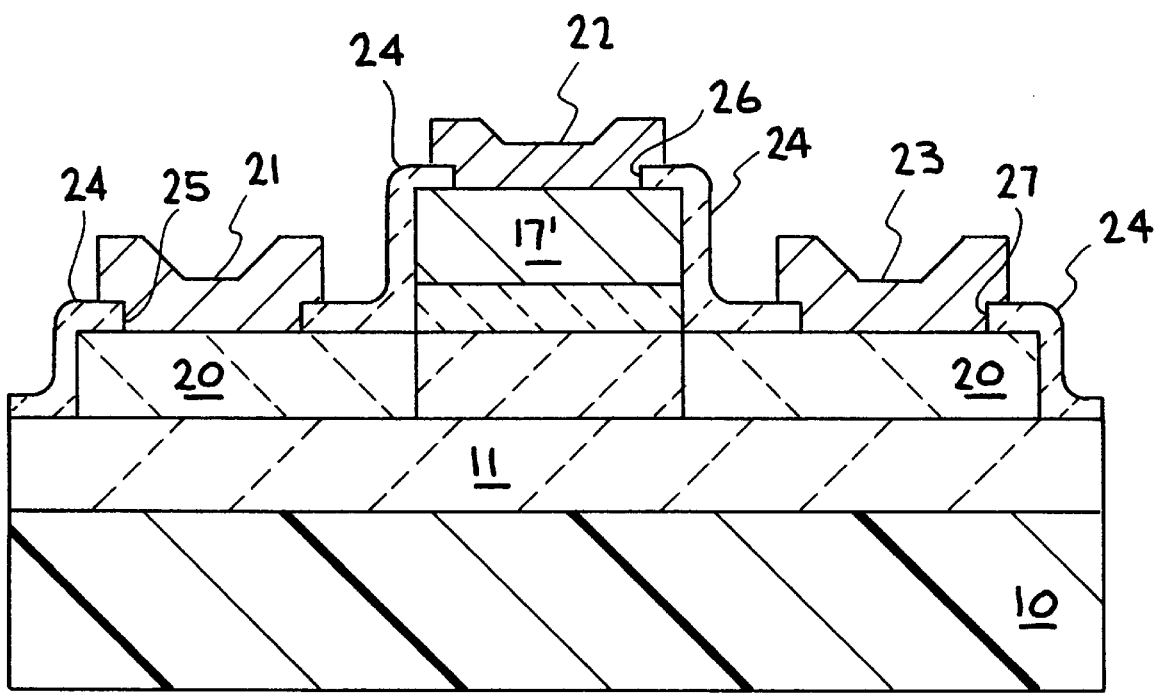
FIG. 4 is a cross-section of the completed embodiment of a TFT on a plastic substrate.

12. The TFT silicon islands or regions (source 21, gate 22, and drain 23), see FIG. 4, are defined using standard photolithography techniques (similar to the gate patterning Step 8 above), as follows:

a. Exposed silicon, such as the outer ends of regions 20 (those not comprising the source 21, channel or gate 22, and drain 23), is removed using an $SF_6$ plasma etch, and the remaining photoresist is removed. Other wet chemical etches or dry etching processes may be substituted in this step.

b. A contact isolation oxide film 24, such as $SiO_2$ or SiN, having a thickness ranging from 20–1000 nm (for example, 80 to 140 nm) is deposited on the thus processed (coated) plastic substrate 10 using PECVD at 100° C. Oxide adhesion to the silicon may be enhanced by an oxygen plasma exposure before deposition, followed by a plasma etch cleaning step in the PECVD reactor for about 10 seconds or more to remove any residual photoresist which may have been cured by exposure to UV light in a previous step.

c. A contact via pattern is then defined using standard photolithographic techniques (see the photolithographic steps in the gate patterning step above).

d. The contact vias indicated at 25, 26, and 27 in FIG. 4 are defined by etching the exposed oxide film 24, such as by immersion in KTI Pad Etch I etch for 40 seconds, followed by a deionized water rinse. Other wet chemical etches or dry etching processes may be substituted in this step.

e. The contact via photoresist is removed using solutions such as acetone and isopropyl alcohol.

f. An Al contact metalization film having a thickness range of 100–2000 nm (for example 800 to 1000 nm) is deposited by a PVD technique, with a sputter or etch cleaning performed in situ immediately prior to deposition.

g. The Al contact metalization pattern is defined using standard photolithographic techniques.

h. The exposed Al is etched by immersion in Al-Type II etch for 10 minutes. The etching time will vary with Al thickness and etch bath temperature (25 to 60° C.). Other wet chemical etches or dry etching processes may be substituted in this step.

i. The Al metalization photoresist is removed, leaving the final TFT structure, including source 21, gate 22, and drain 23, with contacts and interconnects, as shown in FIG. 4. The channel region of gate 22 can be either polysilicon (FIG. 3A) or amorphous silicon (FIG. 3B) depending on whether the crystallization of Step 5 above is performed.

Variations of the Process

1. Replacement of the reflective Al gate with a UV-absorbing gate material, such as silicon, to heat the channel/gate dielectric interface, improving interface properties.

2. Replacement of the Al gate and Al interconnect metalization with a metal or alloy of a different electrical conductivity, such as Cu, Mo, Cr, Ta, W, Ni, Ti, Ti—Si, Al—Si, Al—Cu, Ti—Al, and other alloys with Si, such as silicides.

3. Suitable dielectric layers include silicon nitride and polyamide as well as $SiO_2$.

4. The addition of a bottom-gate silicon TFT process.

5. Low temperature hydrogen passivation of the channel region, either before or after the gate oxide and gate metal depositions.

6. Irradiation of the metalization film to improve metal/silicon contact interface.

7. A predeposited dopant film may be used in place of the doping step.

8. Any of the deposition steps (PECVD, PVD, evaporation, and sputtering) could be replaced by other chemical, physical, ablation, vapor-phase or liquid-phase deposition processes provided the substrate temperature is not allowed to exceed 150° C. for an extended period of time (for example 50 ns to a few seconds ($0.5 = 10^{-7}$ to 2 seconds).

9. For the crystallization and doping steps, instead of using an XeCl pulsed excimer laser (wavelength of 308 nm) with a full width at half maximum of intensity (FWHM) of about 35 ns, there can be substituted XeCl excimer lasers with different FWHM values (15–50 ns), or other excimer lasers such as ArF ($\lambda$=193 nm), KrF ($\lambda$=248 nm), or XeF ($\lambda$=352 nm). In addition, solid state pumped Nd:YAG lasers will also be suitable as irradiation sources. Other pulsed energy beam sources, such as pulsed ion beams or $CO_2$ lasers, could also be used in place of the excimer laser. The dopants may be added by other techniques, such as CVD, ion shower, ion implantation, then ELA'ed to drive in the dopants and crystallize the silicon.

Various low-temperature plastic substrates (both flexible and rigid) may be used, including: poly(ethylene terephthalate) (PET), ethylene-chlorotrifluoro ethylene (E-CTFE), made under the trademark HALAR by Ausimont U.S.A., Inc., ethylene-tetra-fluoroethylene (E-TFE) made under the trademark TEFZEL by Dupont Corporation, polyethersulfone (PES), poly-tetra-fluoro-ethylene (PTFE), fiber glass enhanced plastic (FEP), and high density polyethylene (HDPE).

It has thus been shown that the present invention provides a method for the formation of thin film transistors on low-temperature plastic substrates. The method replaces standard thin film transistor fabrication steps, and sufficiently lowers processing temperatures so that inexpensive plastic substrates may be used in place of standard glass and silicon wafer-based substrates. Plastic substrates have several advantages over conventional substrates such as glass, which include being much less expensive, lighter, more durable, rugged, and flexible. Thus, the present invention enhances the state-of-the-art for the fabrication of TFTs.

While a particular embodiment, operational sequence for fabrication, materials, parameters, etc., have been set forth to exemplify and explain the principles of the invention, such are not intended to be limiting. Modifications and changes may become apparent to those skilled in the art, and it is intended that the invention be limited only by the scope of the appended claims.

The invention claimed is:

1. A method for fabricating silicon thin film transistors on a low-temperature plastic substrate, comprising:
    providing a low temperature plastic substrate,
    forming a first insulating layer on the substrate,
    forming a layer of amorphous silicon on the first insulating layer,
    forming a second insulating layer on the amorphous silicon layer,
    forming a metal layer on the second insulating layer,
    removing a portion of the metal layer,
    removing a portion of the second insulating layer so as to leave at least a portion of the silicon layer exposed,
    doping and crystallizing the exposed silicon layer by pulsed laser processing,
    providing a third insulating layer on the doped silicon layer and a remaining portion of the metal layer,
    forming contact vias in the third insulating layer, and
    forming source, gate, and drain contact and interconnect metalization in the vias.

2. The method of claim 1, additionally including converting at least a portion of the amorphous silicon layer to poly-silicon prior to forming the second insulating layer.

3. The method of claim 2, wherein converting the amorphous silicon to poly-silicon is carried out by directing at least one laser pulse onto at least a portion of the amorphous silicon layer.

4. The method of claim 3, wherein at least one laser pulse is produced by an excimer laser.

5. The method of claim 1, wherein the first and second insulating layers are formed of $SiO_2$, SiN, or polyamide.

6. The method of claim 1, wherein the gate metal layer is formed of Al, Cu, Mo, Cr, Ta, W, Ni, Ti, Si, Ti—Si, Al—Si, Al—Cu, Ti—Al, and silicides.

7. The method of claim 1, wherein the source, gate, and drain interconnect metalization are formed of Al, Cu, Mo, Cr, Ta, W, Ni, Ti, Ti—Si, Al—Si, Al—Cu, Ti—Al, and silicides.

8. The method of claim 1, wherein the doping of the exposed silicon is carried out in a dopant gas selected from the group consisting of $PF_5$, $BF_3$, $B_2H_6$, and $AsF_5$.

9. The method of claim 1, wherein the doping is carried out using a predeposited dopant film by a technique selected from the group of ion shower, ion implantation, and CVD deposition.

10. The method of claim 1, wherein the crystallizing of the exposed silicon is carried out by directing laser pulses thereonto with increasing laser fluences for each of the laser pulses or each group of multiple laser pulses.

11. The method of claim 10, wherein the laser fluences are in a range of 30–600 $mJ/cm^2$.

12. The method of claim 1, wherein doping and/or crystallization of the exposed silicon is carried out under vacuum conditions.

13. The method of claim 1, additionally including forming the low-temperature plastic substrate from material selected from the group consisting of PET, E-CTFE, E-TFE, PES, PTFE, FEP, and HDPE.

14. The method of claim 1, wherein the low temperature plastic substrate is composed of material incapable of withstanding sustained process temperatures of greater than about 250° C.

15. The method of claim 1, wherein forming the first and second insulating layers and the amorphous silicon layer is carried out using a temperature of not greater than about 100° C.

16. The method of claim 1, additionally including subjecting the low-temperature plastic substrate to an annealing temperature of about 110° to 150° C. prior to forming the first insulating layer thereon.

* * * * *